United States Patent
Gilderdale

(12) 
(10) Patent No.: US 6,453,189 B1
(45) Date of Patent: Sep. 17, 2002

(54) PROBE FOR MAGNETIC RESONANCE IMAGING

(75) Inventor: David John Gilderdale, Bovey Tracey (GB)

(73) Assignee: Koninklijke Philips Electronics N.V. (NL)

(*) Notice: Subject to any disclaimer, the term of this patent is extended or adjusted under 35 U.S.C. 154(b) by 146 days.

(21) Appl. No.: 09/713,554

(22) Filed: Nov. 15, 2000

(30) Foreign Application Priority Data

Nov. 16, 1999 (GB) .............................. 9927014
Apr. 4, 2000 (GB) .............................. 0008173

(51) Int. Cl.⁷ .............................. A61B 5/055
(52) U.S. Cl. .............................. 600/423
(58) Field of Search .............................. 600/422, 423; 343/793

(56) References Cited

U.S. PATENT DOCUMENTS

| | | |
|---|---|---|
| 4,572,198 A | 2/1986 | Codrington |
| 5,427,103 A | 6/1995 | Fujio et al. |
| 5,715,822 A | 2/1998 | Watkins et al. |
| 2001/0056232 A1 * | 12/2001 | Lardo et al. ............... 600/423 |

OTHER PUBLICATIONS

Hyde et al, "Planar–Pair Local Coils for High–Resolution Magnetic Resonance Imaging . . . ", Med. Physics (Jan.–Feb. 1986), vol. 13, No. 1, p. 1–7.*

Ergin Atalar, et al.; High Resolution Intravascular MRI and MRS by Using a Catheter Receiver Coil; MRM 36:596–605 (1996).

Ogan Ocali, et al.; Intravascular Magnetic Resonance Imaging Using a Loopless Catheter Antenna; MRM 37:112–118 (1997).

* cited by examiner

Primary Examiner—John A. Jeffery
(74) Attorney, Agent, or Firm—Thomas M. Lundin

(57) ABSTRACT

A magnetic resonance imaging probe includes a dipole including a first arm and a second arm. The second arm includes an elongate loop coil. In one embodiment, the loop coil is an open coil. In another embodiment, the coil is a twisted coil. The first and second arms are electrically connected to provide a dipole output. The second arm is electrically connected to a loop output.

18 Claims, 2 Drawing Sheets

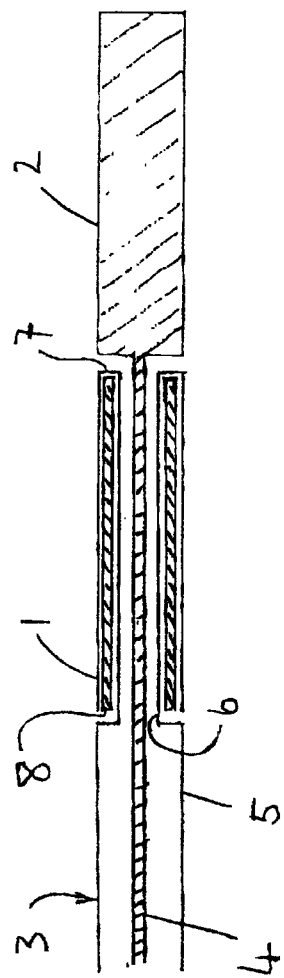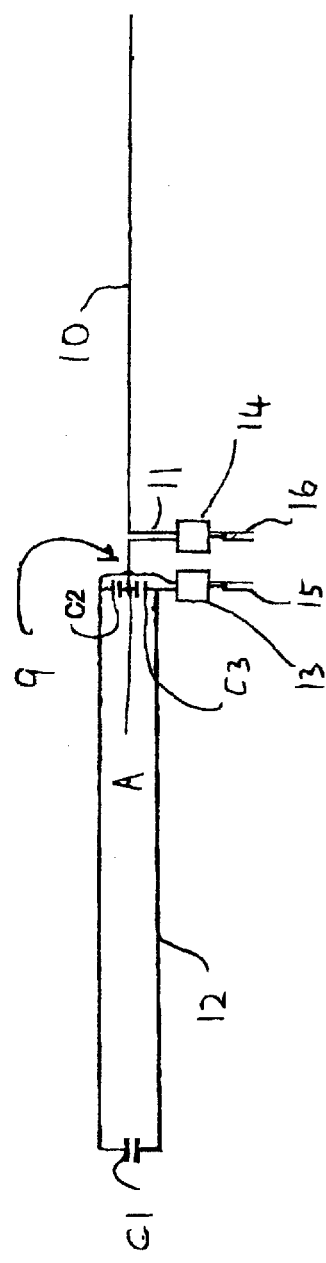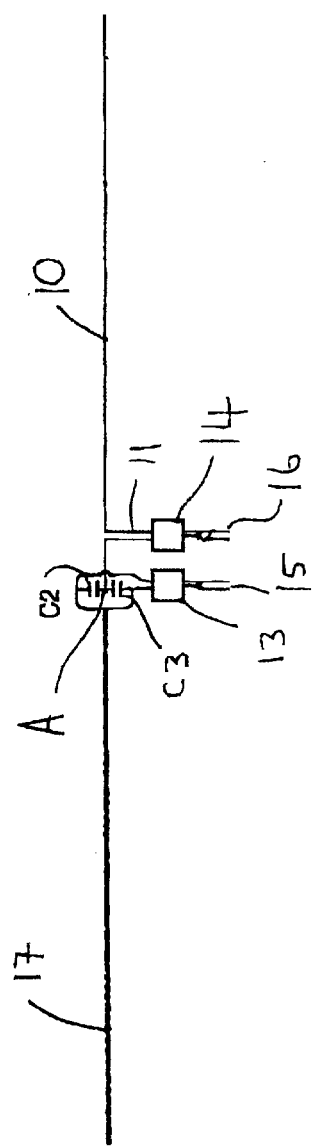

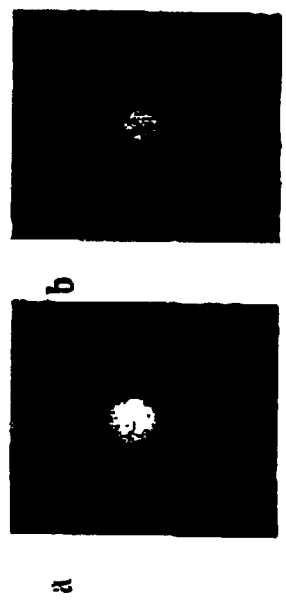

Figure 4 a) Magnitude reconstruction from the common mode signal b) Magnitude reconstruction from the differential mode. Note that in a) the long range sensitivity is apparent by the outer edges phantom structure being visible.

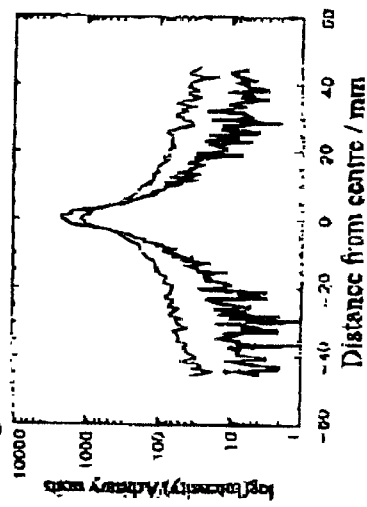

Figure 5 Single lines of data from the centre of the images shown in figure 4. The black line is from the differential mode and the grey line from the common mode. A crossing point is seen at ~5mm from the peak intensity.

PROBE FOR MAGNETIC RESONANCE IMAGING

BACKGROUND

This invention relates to probes for magnetic resonance (MR) imaging apparatus.

It has recently been demonstrated that MR probes may be built into catheters, allowing diagnostically useful high resolution images to be obtained from within small, intravascular, structures.

These catheter probes have been either of the elongated-loop type, with high local sensitivity, (High Resolution Intravascular MRI and MRS by Using a Catheter Receiver Coil, by Ergin Atalar, Paul A Bottomley, Ogan Ocali, Luis C L Correia, Mark D Kelemen, Joao A C Lima and Elias A Zerhouni, Magn. Reson. Med. 36:596–605 (1996)), or of the loop-less antenna design with lower local sensitivity but superior field of view (Intravascular Magnetic Resonance Imaging Using a Loop-less Catheter Antenna, by Ogan Ocali and Ergin Atalar, Magn. Reson. Med. 37:112–118 (1997)). The former is primarily coupled to the magnetic field, the latter primarily coupled to the electric field.

FIG. 1 is an axial sectional view of the latter. The probe is intended to be inserted axially in the right-hand direction as seen in the drawing. The antenna is a dipole 1, 2, consisting of a hollow conductor 1, and a solid conductor 2, both of the same diameter. The feed is a coaxial cable indicated generally by the reference numeral 3, the centre conductor 4 of which connects to the arm 2, and the coaxial sheath 5 of which has a reduced diameter region 6 which connects to the right-hand end of the hollow arm 1 via a region 7. An insulator 8 separates the hollow arm 1 from the reduced diameter part 6 of the coaxial sheath 5 of the feed 3. Capacitance between these two would cause current to leak from the arm 1, so the dielectric constant of the insulator, in conjunction with the diameter of the parts 1, 6, is chosen so that the transmission line formed by the parts 1, 8, 6 is one quarter-wavelength in length, which creates a high impedance between the left-hand end of the arm 1 and the part 6, thus reducing leakage current. The length of the arm 2 is also one quarter-wavelength, that is, of the magnetic resonance frequency and in the material of the tissue in which it is to be used.

SUMMARY

The invention provides a probe for magnetic resonance imaging apparatus, comprising a dipole, one arm of which includes an elongate receive loop.

The probe is capable of performing the role of loop-less dipole and of elongated receive loop. In one embodiment, the probe is capable of simultaneous imaging in both modes. By combining the signals from the two modes, the field of view of the probe might be increased, with the possibility of SNR gains close to the coil.

DRAWINGS

Ways of carrying out the invention will now be described in greater detail, by way of example, with reference to the accompanying drawings, in which:

FIG. 1 is an axial sectional view of a known loop-less dipole probe for magnetic resonance imaging;

FIG. 2 is a schematic front view of a first form of probe;

FIG. 3 is a schematic front view of a second form of probe;

FIG. 4 is a magnitude reconstruction of the signals from the probe of FIG. 2; and FIG. 5 shows lines of data from the centre of the images of FIG. 4.

DESCRIPTION

The magnetic resonance imaging apparatus consists of a magnet for producing a uniform magnetic field over a region of interest, means for producing gradients in the magnetic field to encode proton spins in a subject in the region of interest, and r.f. excitation means for exciting resonance in the protons, and for receiving the relaxation signals generated by the protons. The magnet may be a superconducting or resistive electromagnet, or a permanent magnet.

The probes of the invention may be built into catheters, which may be inserted into small intravascular structures.

The probes receive magnetic resonance signals from excited magnetic resonant active nuclei in the vicinity of the path of the probe, to enable diagnostically useful high resolution images to be obtained.

Referring to FIG. 2, the first form of probe is a dipole having an arm indicated generally by the reference numeral 9, and an arm 10, each one quarter-wavelength at the magnetic resonance frequency in the tissue in which it is inserted, and a central feed 11. The arm 9 is formed by an elongate receive loop 12, connected to the central feed 11 at a point of electrical balance A. A capacitor C1 in the loop 12 is provided for tuning the loop to the frequency of magnetic resonance, and capacitors C2, C3 are provided for matching the loop to give a 50Ω impedance with the point of balance A (at the junction of capacitors C2, C3).

Baluns 13, 14 connect the outputs of the loop 12 (taken across the capacitors C2, C3), and the dipole 9, 10, to respective 50Ω coaxial cables 15, 16 connected to separate channels of the magnetic resonance imaging apparatus.

In the dipole (common) mode, the current flow is in the same direction in both sides of the dipole, and equal currents flow in the same direction in both sides of the loop 12. In the loop (differential) mode, the current flows in opposite directions in both sides of the loop 12. The two modes are able to exist simultaneously and independently. Both signals may be combined: the field of view of the loop coil may be increased, and there is a possibility of SNR gains close to the coil. Equally, one or other signal may be used alone at any particular point in time if desired.

Balun 13 provides a high impedance between point A and coaxial cable 15, an essential requirement for mode isolation. Otherwise current from the dipole mode would leak to coaxial cable 15. Voltage developed across C2, C3 applies voltage across balun 13, resulting in a current in the coaxial cable 15, but current cannot flow between either side of the loop 12 and the coaxial cable 15.

The balun 13 may be a four terminal two inductance two capacitance bridge circuit, with the property that there are 50Ω impedances between the input terminals and between the output terminals, but high impedances in each direction between each input terminal and the output terminal on the same side, in each case at one particular frequency, that is, the magnetic resonance frequency.

Balun 14 is included to reduce shield currents in the dipole mode by isolating the dipole mode from ground, but is not crucial to circuit operation. The balun 14 may be a four terminal two inductance two capacitance bridge circuit like the balun 13.

The baluns 13, 14 also contain circuits for de-tuning the dipole and the loop 12 when the r.f. excitation pulses are applied to excite magnetic resonance.

For simplicity, FIG. 2 shows a conventional dipole, but in practice a "folded-back" balancing transformer would be needed. That is, one of the arms, such as arm 10 would be hollow, the feed 11 would be carried inside the arm, and insulation in the arm would form a quarter-wavelength transmission line. An arrangement such as shown for the known dipole in FIG. 1 could be used.

In one example, the dipole/loop structure was immersed in 0.9% saline solution and the output impedance measured using a vector impedance meter. For the imaging tests, a matching/de-tuning circuit was included for the common mode as well as a de-tuning circuit for the differential mode.

A prototype probe assembly, with a loop coil conductor spacing of 1 mm and length)$\lambda$/4 in water, was imaged transversely using a 0.5 T Picker Apollo system (Cleveland Ohio). A simple spin echo sequence was used: TR/TE 200/10 ms; 180 mm field of view; 5 mm slice thickness; 128×256 acquisition matrix. Data was acquired simultaneously from both modes via separate pre-amplifiers and receive channels; these data were then reconstructed into separate images.

FIGS. 4a, 4b show images obtained simultaneously from the common mode and differential modes respectively. The superior long range performance is demonstrated in FIG. 4a, since the fall extent of the phantom is clearly visible. The differential mode produced the characteristic high SNR close to the conductors, but SNR is negligible for radii >20 mm. FIG. 5 shows the spatial sensitivity profiles for both modes using data taken from a single line of the magnitude images shown in FIGS. 4a, b. SNR parity occurs at a radius of ~5 mm.

Thus, the invention provides a loop coil structure built into a dipole antenna so as to allow two modes of operation. The signals are extracted independently and may be used to create a combined image with SNR superior to that from either mode operating alone.

Referring to FIG. 3, the technique may be applied to other coil structures, such as a twisted-pair tracking coil. In this case, the two modes will provide two quite separate functions, the differential mode providing tracking information with its minimal field of view, the common mode providing imaging information over a larger area.

Like reference numerals have been given in FIG. 3 to the same parts as in FIG. 2. The probe is based on the catheter probe of FIG. 2. The only difference is that the open elongated loop coil 12 is replaced by a tightly twisted coil loop 17 (left side of dipole). This has the effect of confining the loop-mode flux to a region very close to the wire, producing a very localised image specifically suited to tracking. Currents induced into each section of the loop defined by one twist are cancelled by currents induced into the next section of the loop defined by the next twist, as far as sensitive areas of some distance from the wire are concerned. In contrast, the loop-less (dipole) mode provides useful signal within a radius typically 3 cms from the wire, thus providing useful images of surrounding anatomical structures such as arterial walls etc. Since data are acquired simultaneously from both modes, the probe is able to satisfy two, normally conflicting, requirements in a single device. Alternatively, as with the probe of FIG. 2, the two modes could be alternated between.

Note that as in the previous dual-mode design, the current in the loop-less mode flows in the same direction in both sides of the dipole and in both wires of the twisted-pair. In the loop mode, of course, the current in the twisted wires flows in opposite directions.

The arm 10 of the dipole could be hollow to accommodate the feed, so allowing twisted section 17 to be the leading end of the probe.

The invention has been described with reference to the preferred embodiments. Obviously, modifications and alterations will occur to others upon reading an understanding the preceding description. It is intended that the invention be construed as including all such modifications and alterations insofar as they come within the scope of the appended claims or the equivalents thereof.

What is claimed is:

1. A magnetic resonance imaging probe comprising a dipole including a first arm and a second arm, wherein the second arm includes an elongate loop coil.

2. The magnetic resonance imaging probe of claim 1 wherein the elongate loop coil comprises an open coil.

3. The magnetic resonance imaging probe of claim 1 wherein the elongate loop coil comprises a twisted coil.

4. The magnetic resonance imaging probe of claim 1 wherein the first and second arms are electrically connected to a dipole output.

5. The magnetic resonance imaging probe of claim 1 comprising impedance matching circuitry electrically connected between the second arm and the dipole output.

6. The magnetic resonance imaging probe of claim 4 wherein the first arm includes a hollow conductor and the first arm is electrically connected to the dipole output via a conductor disposed in the hollow.

7. The magnetic resonance imaging probe of claim 4 wherein the second arm is electrically connected to a loop output.

8. The magnetic resonance imaging probe of claim 7 including a balun electrically connected between the second arm and the loop output.

9. The magnetic resonance imaging probe of claim 8 wherein
   the second arm includes first and second series connected capacitors;
   the balun is electrically connected to the series connected capacitors; and
   the junction of the series connected capacitors is electrically connected to the dipole output.

10. The magnetic resonance imaging probe of claim 8 wherein the balun comprises circuitry for selectively detuning the second arm.

11. The magnetic resonance imaging probe of claim 1 wherein probe is insertable within a catheter.

12. A magnetic resonance imaging probe comprising:

a first coil portion; and a second coil portion operable in a differential mode to provide a differential mode output and in a common mode, wherein the first and second coil portions are operatively connected to provide a common mode output.

13. The magnetic resonance imaging probe of claim 12 further comprising a balun for isolating the differential mode output from common mode signals.

14. The magnetic resonance imaging probe of claim 12 wherein the first and second coil portions form a dipole.

15. The magnetic resonance imaging probe of claim 14 wherein the second coil portion comprises an elongate loop coil.

16. The magnetic resonance imaging probe of claim 14 comprising first and second capacitors arranged in series with the loop coil, a voltage generated across the capacitors providing a differential mode signal.

17. The magnetic resonance probe of claim 16 wherein the first coil portion comprises a hollow conductor and the first coil portion is electrically connected to the common mode output via a conductor disposed in the hollow.

18. The magnetic resonance imaging probe of claim 12 further comprising a catheter and wherein the first and second coil portions are disposed in the catheter.

* * * * *